United States Patent [19]

Badyal

[11] Patent Number: 5,337,008

[45] Date of Patent: Aug. 9, 1994

[54] HIGH GAIN RAIL-TO-RAIL CMOS AMPLIFIER

[75] Inventor: Rejeev Badyal, Corvallis, Oreg.

[73] Assignee: Hewlett-Packard Corporation, Palo Alto, Calif.

[21] Appl. No.: 23,254

[22] Filed: Feb. 25, 1993

[51] Int. Cl.5 .............................................. H03F 3/45
[52] U.S. Cl. ................................... 330/253; 330/257; 330/285; 330/264
[58] Field of Search ............... 330/252, 253, 255, 257, 330/264

[56] References Cited

U.S. PATENT DOCUMENTS 4,554,515  11/1985  Burson et al. ......................... 330/253
4,958,133  9/1990  Bazes .................................... 330/255

*Primary Examiner*—James B. Mullins
*Assistant Examiner*—J. Dudek

[57] ABSTRACT

A CMOS operational amplifier input senses a rail-to-rail differential voltage and provides an amplifier rail-to-rail single-ended output voltage. A first P-channel input section sources a first differential signal current that is proportional to a first portion of the input voltage, and a second N-channel input section sinks a second differential signal current that is proportional to a second portion of the input voltage. The first and second differential currents are combined in a folded cascode gain stage to produce an intermediate single-ended voltage that is not rail-to-rail. The single-ended intermediate voltage is converted to a rail-to-rail output voltage in a current-limited rail-to-rail output section.

16 Claims, 3 Drawing Sheets

HIGH GAIN RAIL-TO-RAIL CMOS AMPLIFIER

BACKGROUND OF THE INVENTION

This invention relates generally to operational amplifiers and, more particularly, to CMOS rail-to-rail operational amplifiers.

Operational amplifiers are well known electrical components that typically amplify a small differential input voltage to provide a highly amplified single-ended output voltage. CMOS amplifiers are typically powered by a positive power supply voltage designated $V_{DD}$ and a negative power supply voltage designated $V_{SS}$, sometimes referred to as "power supply rails" or simply "rails". One limitation of operational amplifiers, including CMOS operational amplifiers, is that the input section cannot sense voltage throughout the entire voltage range determined by the power supply voltages. This is due to the constraints of most circuit designs, wherein a volt or more is necessary to bias the transistors in the input section. Consequently, when the input voltage is within a volt of the power supply rails it will not be sensed by the input section. Similarly, the output voltage typically cannot track through the entire voltage range because of the necessary bias voltage overhead in the output section.

Referring now to FIG. 1, a maximum voltage, $V_{MAX}$, and a minimum voltage, $V_{MIN}$, determine the effective operational range for the operational amplifier. The voltages $V_{MAX}$ and $V_{MIN}$ can be different for the input and output sections and are determined not only by circuit design, but by semiconductor process limitations and environmental factors such as temperature.

It is desirable to increase the operational range for both the input and output voltages as much as possible, and even up to the supply voltages, i.e., full "rail-to-rail" operation. While full rail-to-rail operation is desirable, existing CMOS designs are extremely complex and include many active devices. The complex designs increase chip area and cost. An example of a prior art CMOS rail-to-rail operational amplifier is shown in "A Rail-to-Rail CMOS Op Amp" by J. N. Babanazhad, *IEEE Journal of Solid-State Circuits* Vol. 23. No. 6, December 1988, pp. 1414–1417.

Accordingly, a need remains for a CMOS operational amplifier that has full rail-to-rail operation while having a simple circuit design using a minimum number of transistors.

SUMMARY OF THE INVENTION

It is, therefore, an object of the invention to provide an operational amplifier with full input and output rail-to-rail capability.

Another object of the invention is to provide a CMOS rail-to-rail operational amplifier with a minimum number of active devices and minimum integrated circuit area.

According to the present invention, a CMOS operational amplifier input senses a rail-to-rail differential voltage and provides an amplifier rail-to-rail single-ended output voltage. A first P-channel input section sources a first differential signal current that is proportional to a first portion of the input voltage, and a second N-channel input section sinks a second differential signal current that is proportional to a second portion of the input voltage. The first and second differential currents are combined in a folded cascode gain stage to produce an intermediate single-ended voltage that is not rail-to-rail. The single-ended intermediate voltage is converted to a rail-to-rail output voltage in a current-limited rail-to-rail output section.

The foregoing and other objects, features and advantages of the invention will become more readily apparent from the following detailed description of a preferred embodiment of the invention which proceeds with reference to the accompanying drawings.

DETAILED DESCRIPTION

Figure 1:
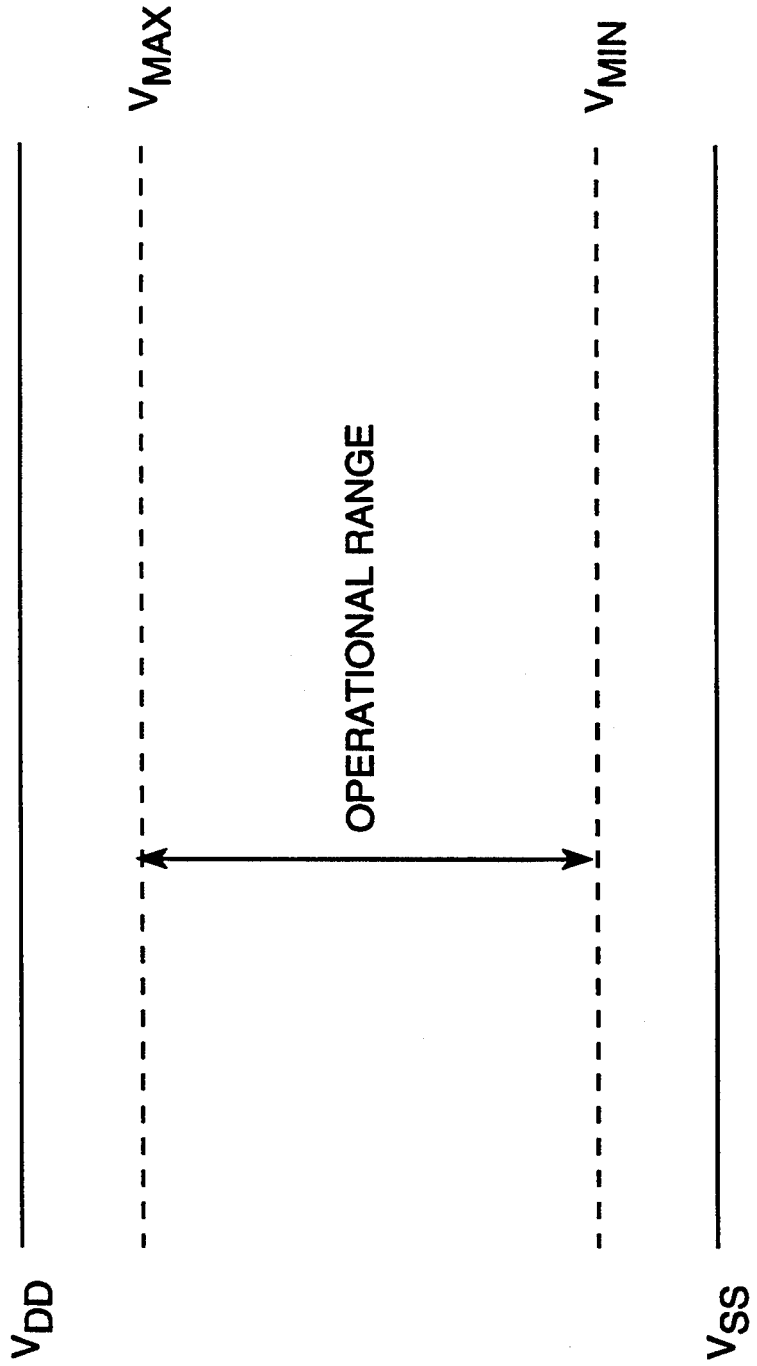
FIG. 1 is a graph showing the reduced operating range of most operational amplifiers.
Figure 2:
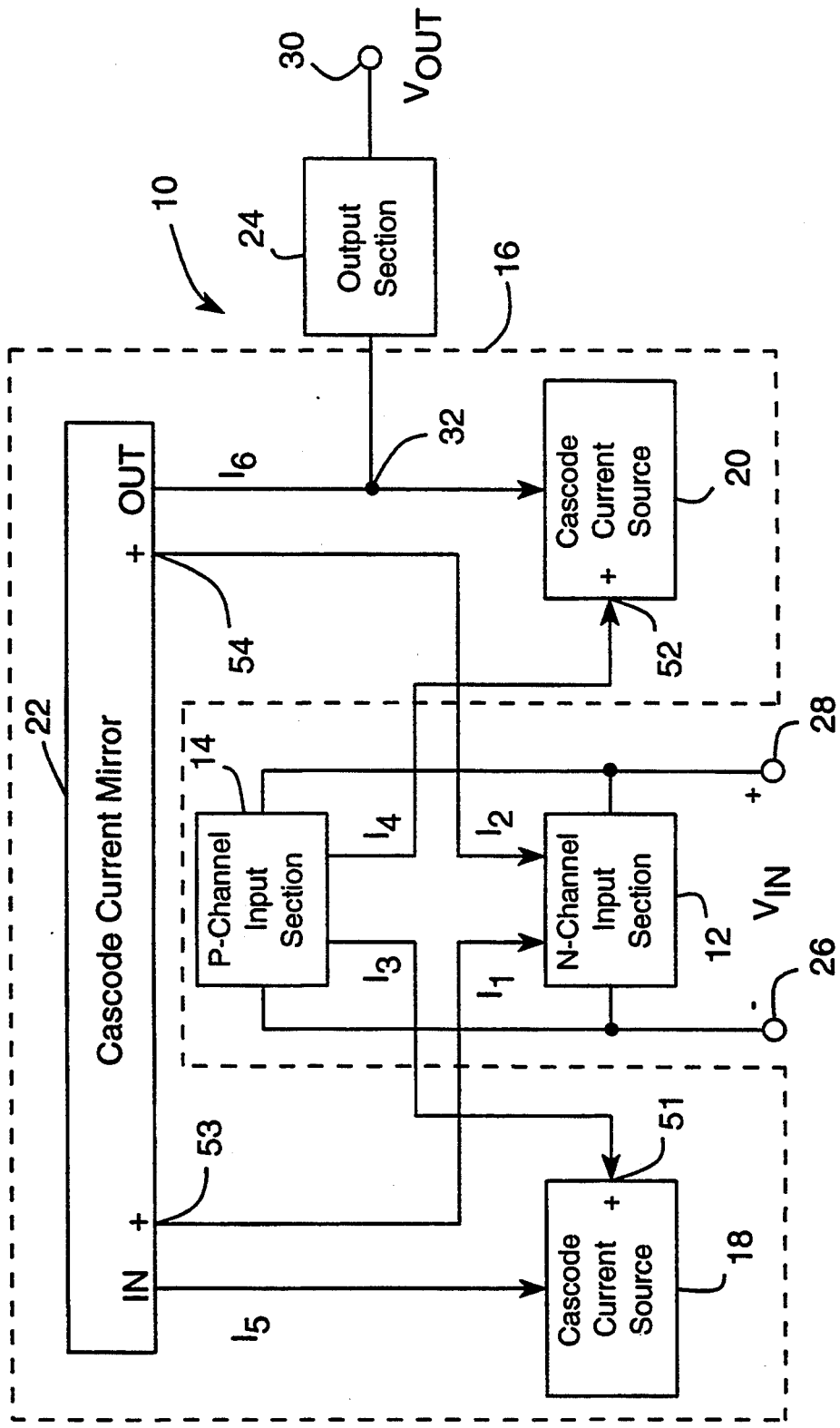
FIG. 2 is a block diagram of the operational amplifier of the present invention.

Referring to FIG. 2, a CMOS amplifier circuit 10 is shown having a differential input and a single-ended output. The differential input consists of a negative input terminal 26 and a positive input terminal 28. An input voltage signal $V_{IN}$ is impressed across the input terminals 26 and 28. An N-channel input section 12 has a differential input coupled to the differential input 26, 28 of amplifier circuit 10. The N-channel input section 12 has a differential output for sinking signal currents $I_1$ and $I_2$ from cascode current mirror 22. Similarly, a P-channel input section 14 has a differential input coupled to the differential input terminals 26, 28 of amplifier circuit 10. The P-channel input section 14 also includes a differential output for sourcing signal currents $I_3$ and $I_4$ to a first cascode current source 18 and a second cascode current source 20, respectively. The use of both the N-channel input section 12 and the P-channel input section 14 allow the input signal $V_{IN}$ to extend over the entire voltage range of the power supply.

A folded cascode gain stage 16 consists of first cascode current source 18, second cascode current source 20, and cascode current mirror 22. Cascode gain stage 16 has a first and second summing nodes 51 and 52 coupled to the differential current output of the P-channel input section 14 for receiving signal currents $I_3$ and $I_4$. The folded cascode gain stage 16 also includes a third and fourth summing nodes 53 and 54 coupled to the differential output of the N-channel input section 12 for sourcing signal currents $I_1$ and $I_2$. Cascode current mirror 22 has an input ("IN") coupled to the first cascode current source 18 for supplying current $I_5$. Cascode current mirror 22 includes an output ("OUT") that is coupled to the second cascode current source 20 for supplying current $I_6$. Cascode current mirror output ("OUT") is coupled to the input of a rail-to-rail output section 24. The rail-to-rail output section has a single-ended output 30, that is the output of the amplifier.

Figure 3:
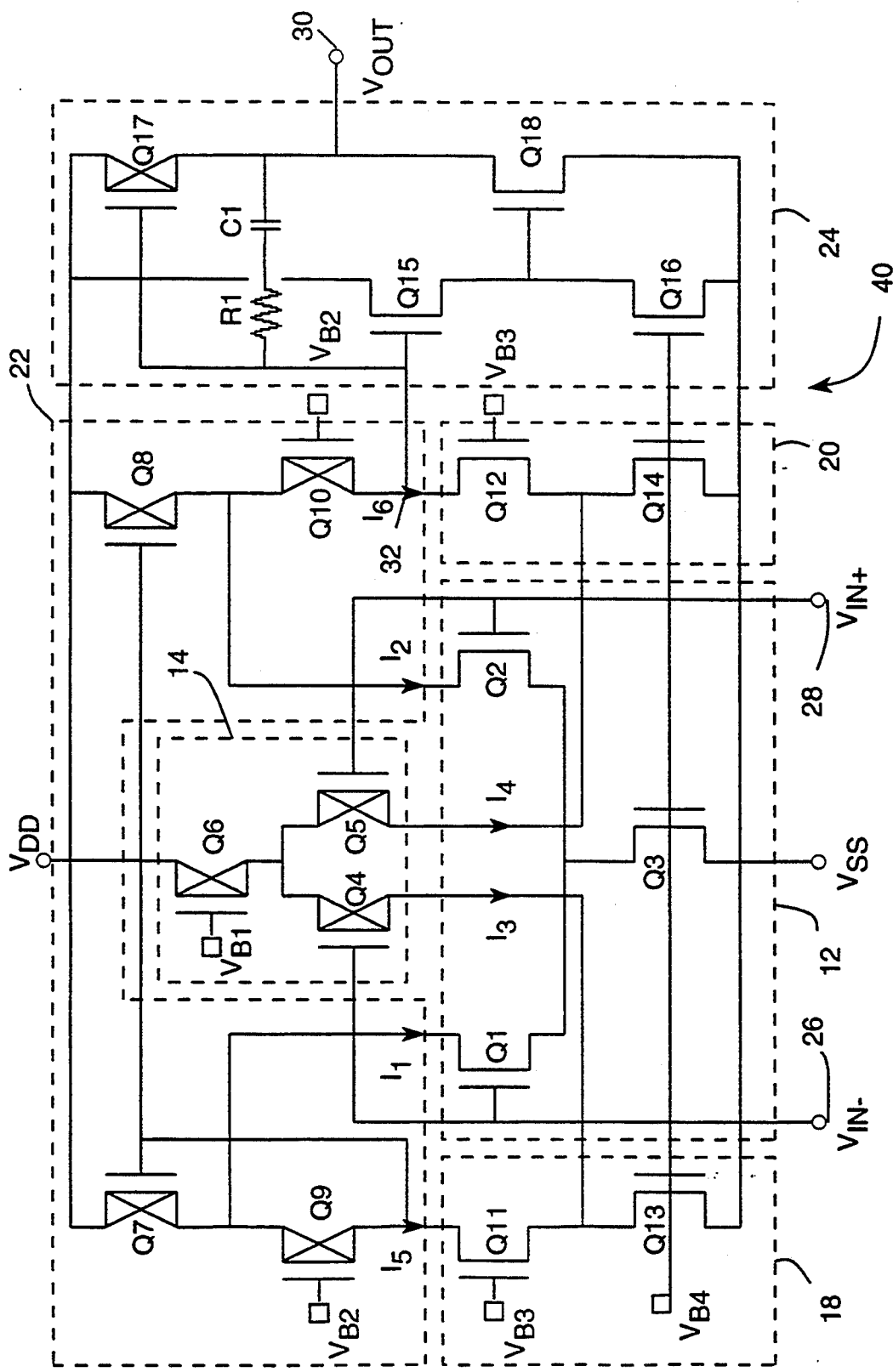
FIG. 3 is a schematic diagram at the transistor level of the operational amplifier of the present invention.

Referring now to FIG. 3, a CMOS transistor level schematic of the block diagram of FIG. 2 is shown generally at 40. The N-channel input section 12 consists of a three transistor differential amplifier consisting of N-channel FRETS Q1, Q2 and Q3. The negative differential input terminal 26 is coupled to the gate of transistor Q1. The positive differential input terminal 28 is coupled to the gate of transistor Q2. The sources of transistors Q1 and Q2 are coupled together to form a common source node that is further coupled to the drain of transistor Q3. The source of transistor Q3 is coupled to a second source of supply voltage $V_{SS}$. Transistor Q3 has a gate coupled to a fourth source of bias voltage $V_{B4}$. The fourth source of bias voltage biases transistor Q3 to conduct a constant current approximately equal to the sum of $I_1$ and $I_2$ and, thus, act as a current source for differential input transistors Q1 and Q2.

The P-channel input section 14 is shown consisting of a three P-channel FETS Q4, Q5 and Q6. Transistor Q4 has a drain for producing a signal current $I_3$, a gate coupled to the negative differential input terminal 26, and a source. Transistor Q5 has a drain for producing signal current $I_4$, a gate coupled to the positive differential input terminal 28, and a source coupled to the source of transistor Q4 to form a common source node. The drain of transistor Q6 is coupled to the common source of transistors Q4 and Q5. The source of transistor Q6 is coupled to a first source of supply voltage $V_{DD}$. The gate of transistor Q6 is coupled to a first source of bias voltage $V_{B1}$ for biasing transistor Q6 to act as a P-channel bias transistor for the differential pair formed by transistors Q4 and Q5. Transistor Q6 is biased to conduct a constant current approximately equal to the sum of $I_3$ and $I_4$.

The N-channel input section 12 is operable when the input voltage signal as seen on the basis of transistors Q1 and Q2 exceeds the voltage drop across transistor Q3 and the corresponding input transistor Q1 or Q2. Given that the input transistors Q1 and Q2, as well as the bias transistor Q3 have to remain in saturation, the input voltage signal must exceed two drain-to-source saturation voltage drops, $V_{DSAT}$, by a threshold voltage $V_t$ in order to be operable. The N-channel input section 12 will remain operable until the input voltage signal comes within one $V_{DSAT}$ of the first source of voltage $V_{DD}$, in order for P-channel transistors Q7 or Q8 to remain in saturation.

Similarly, the P-channel input section 14 becomes operable when the input voltage signal falls below $V_{DD}$ by two drain-to-source saturation voltage drops, i.e., $2 \times V_{DSAT}$, plus a threshold voltage drop $V_T$, in order for bias transistor Q6 and P-channel input transistors Q4 and Q5 to remain in saturation. The P-channel input section 14 will remain operable as long as the input voltage signal remains above the second source of voltage supply $V_{ss}$ by at least one $V_{DSAT}$ to account for the drain-to-source voltage drop $V_{DSAT}$ across the cascode current source transistors Q13 or Q14. Thus, the combination of the N-channel input section and the P-channel input section allow the input voltage to swing within one $V_{DSAT}$ of either voltage rail.

The folded cascode gain stage consists of P-channel transistors Q7, Q8, Q9 and Q10 and N-channel transistors Q11, Q12, Q13 and Q14. The folded cascode gain stage consists of three subsections: a cascode current mirror 22 consisting of P-channel transistors Q7, Q5, Q9 and Q10; the first cascode current source 18 consisting N-channel transistor Q11 and Q13; and second cascode current source 20 consisting of N-channel transistors Q12 and Q14.

The cascode current minor 22 consists of a P-channel transistor Q7 having a source coupled to the first source of supply voltage $V_{DD}$, a gate, and a drain forming a third summing node. P-channel transistor Q8 has a source coupled to the first source of supply voltage VDD, a gate coupled to the gate of transistor Q7, and a drain forming a fourth summing node. P-channel transistor Q9 has a source that is coupled to the drain of transistor Q7, a base coupled to a second source of bias voltage VB2, and a source that is coupled to the gates of transistors Q7 and Q8. The third summing node is then coupled to the drain of N-channel transistor Q1 for supplying signal current $I_1$. Transistor Q10 has a source that is coupled to the drain of transistor Q8, a gate for receiving the second source of biased voltage $V_{B2}$, and a source which forms the current mirror output 32. The fourth summing node is then coupled to the drain of transistor Q2 for supplying signal current I2.

Folded cascode gain stage also includes a first cascode current source 18 consisting of N-channel transistors Q11 and Q13. Transistor Q11 has a drain that is coupled to the drain of transistor Q9, a gate coupled to a third source of bias voltage $V_{B3}$, and a source. Transistor Q13 has a drain coupled to the source of transistor Q11, a gate coupled to the fourth source of bias voltage $V_{B4}$, and a source coupled to the second source of supply voltage $V_{ss}$. The source of transistor Q11 and the drain of transistor Q13 are coupled to the drain of transistor Q4 for receiving signal current I3 from the P-channel input section 14.

Folded cascode gain stage also includes second cascode current source 20 consisting of transistors Q12 and Q14. Transistor Q12 has a drain coupled to the drain of transistor Q10 for receiving bias current I6, a gate coupled to the third source of bias voltage $V_{B3}$, and a source. Transistor Q14 has a drain that is coupled to the source of transistor Q12, a gate coupled to the fourth source of bias voltage $V_{B4}$, and a source coupled to the second source of supply voltage $V_{ss}$. The drain of transistor Q14 and the source of transistor Q12 are further coupled to the drain of transistor Q5 for receiving signal current I4.

The rail-to-rail output section 24 is coupled to the folded cascode gain stage at circuit node 32. The rail-to-rail output section 24 consists of P-channel transistor Q17 and N-channel transistors Q15, Q16 and Q18. Transistor Q15 has a gate forming the input of the output section 24 that is coupled to the output of the cascode current mirror 22 at circuit node 32, a drain coupled to the first source of supply voltage $V_{DD}$, and a source. Transistor Q16, which acts as a current source for transistor Q15, has a drain that is coupled to the source of transistor Q15, a gate that is coupled to the fourth source of bias voltage $V_{B4}$, and a source that is coupled to the second source of supply voltage $V_{ss}$. Transistors Q15 and Q16 act to level shift the output of the cascode current mirror 22 to minimize the power consumption of transistors Q17 and Q18 by not allowing the gates of transistors Q17 and Q18 to be at the same voltage level. Transistor Q17 has a gate that is coupled to the gate of transistor Q15, a source to the first source of supply voltage $V_{DD}$, and a drain coupled to the output terminal 30 of the amplifier circuit. Transistor Q18 has a gate coupled to the source of Q15 and the drain of Q16, a source coupled to the second source of supply voltage $V_{ss}$, and a drain coupled to the drain of transistor Q17. As a result of this arrangement in the output stage, the amplifier is of a class AB type. It can be seen that the voltage produced at the gate of transistor Q18 will be one threshold voltage drop $V_T$ below that received on the gate of transistor Q17.

A dominant pole of the amplifier circuit is produced at output 32 of the folded cascode gain stage. Therefore a compensation network consisting of a resistor R1 in series with capacitor C1 is coupled between the output of the cascode gain stage and the output terminal 30 of the amplifier circuit. In the preferred embodiment, the resistor R1 has a value of 1 kΩ and the capacitor has a capacitance value of 10 pF, although these values are dependent on the load driven by the amplifier. This dominant pole produces a stable and non-oscillating amplifier circuit.

Folded cascode stage combines signal currents from input section 12 and 14, which produce a single-ended output voltage at circuit node 32. Essentially this voltage is equal to the combined signal currents multiplied by the parallel output impedance at the drains of transistors Q10 and Q12.

Another, alternative mode of analysis is that transistors Q13 and Q14 generate first and second bias currents, which are augmented by currents $I_3$ and $I_4$. Those currents are applied to the input and output current mirror. The gain of current mirror 22 is essentially augmented by currents $I_1$ and $I_2$.

In operation then, op amp 10 senses a first portion of a rail-to-rail input voltage, produces a differential current of a first polarity proportional to the first portion of the input voltage, senses a second portion of a rail-to-rail input voltage, and produces a differential current of a second polarity proportional to the second portion of the input voltage. The folded cascode stage 16 combines the differential current of the first and second polarities and produces a single-ended voltage in response to the combined differential current. The output stage 24 converts the single-ended voltage into a rail-to-rail single-ended output voltage.

Having described and illustrated the principles of the invention in a preferred embodiment thereof, it is apparent to those skilled in the art that the invention can be modified in arrangement and detail without departing from such principles. I therefore claim all modifications and variation coming within the spirit and scope of the following claims.

I claim:

1. A CMOS amplifier circuit comprising:
   a differential input and a single-ended output;
   a P-channel input section having a differential input coupled to the differential input of the amplifier, and a differential output;
   an N-channel input section having a differential input coupled to the differential input of the amplifier, and a differential output;
   a cascode current mirror having an input, an output, and a pair of summing nodes coupled to the differential output of the N-channel input section;
   a first cascode current source having an output coupled to the input of the cascode current mirror, and a summing node;
   a second cascode current source having an output coupled to the output of the cascode current mirror, and a summing node, wherein the summing nodes of the first and second cascode current sources are coupled to the differential output of the P-channel input section; and
   a rail-to-rail output section having an input coupled to the output of the cascode current mirror and an output coupled to the single-ended output of the amplifier, the rail-to-rail section including means for limiting the current through the output section.

2. A CMOS amplifier circuit as in claim 1 in which the P-channel input section comprises a differential pair of P-channel transistors having a common source node coupled to a P-channel bias transistor.

3. A CMOS amplifier circuit as in claim 1 in which N-channel input section comprises a differential pair of N-channel transistors having a common source node coupled to an N-channel bias transistor.

4. A CMOS amplifier circuit as in claim 1 in which the cascode current mirror comprises:
   a first P-channel transistor having a source coupled to a source of supply voltage, a gate, and a drain forming one summing node of said pair;
   a second P-channel transistor having a source coupled to the source of supply voltage, a gate coupled to the gate of the first P-channel transistor, and a drain forming the other summing node of said pair;
   a third P-channel transistor having a source coupled to the drain of the first P-channel transistor, a base coupled to a bias voltage source, and a drain coupled to the gates of the first and second P-channel transistors and forming the current mirror input; and
   a fourth P-channel transistor having a source coupled to the drain of the second P-channel transistor, a base coupled to the bias voltage source, and a drain forming the current mirror output.

5. A CMOS amplifier circuit as in claim 1 further comprising a passive compensation network coupled between the input and the output of the rail-to-rail output section.

6. A CMOS amplifier circuit as in claim 5 in which the compensation network comprises a resistor of about 1 KΩ in series with a capacitor of about 10 pF.

7. A CMOS amplifier circuit comprising:
   a differential input and a single-ended output;
   a P-channel input section having a differential input coupled to the differential input of the amplifier, and a differential output;
   an N-channel input section having a differential input coupled to the differential input of the amplifier, and a differential output;
   a cascode current mirror having an input, an output, and a pair of summing nodes coupled to the differential output of the N-channel input section;
   a first cascode current source having an output coupled to the input of the cascode current mirror, and a summing node;
   a second cascode current source having and output coupled to the output of the cascode current mirror, and a summing node, wherein the summing nodes of the first and second cascode current sources are coupled to the differential output of the P-channel input section;
   a rail-to-rail output section having an input coupled to the output of the cascode current mirror and an output coupled to the single-ended output of the amplifier;
   the rail-to-rail output section comprising:
     a first N-channel transistor having a drain coupled to a first source of supply voltage, a gate forming the input of the output section, and a source;
     a second N-channel transistor having a drain coupled to the source of the first N-channel transistor, a gate coupled to a bias voltage source, and a source coupled to a second source of supply voltage;
     a third N-channel transistor having a drain coupled to the output of the output section, a gate coupled to the source of the first N-channel transistor, and a source coupled to the second source of supply voltage; and
     a P-channel transistor having a drain coupled to the output of the output section, a gate coupled to the input of the output section, and a source coupled to the first source of supply voltage.

8. A CMOS amplifier circuit comprising:
a differential input and a single-ended output;
a P-channel input section having a differential input coupled to the differential input of the amplifier, and a differential output;
an N-channel input section having a differential input coupled to the differential input of the amplifier, and a differential output;
a folded-cascode gain stage having first and second summing nodes coupled to the differential output of the P-channel input section, third and fourth summing nodes coupled to the differential output of the N-channel input section, and an output; and
a rail-to-rail output section having an input coupled to the output of the folded-cascode gain stage and an output coupled to the single-ended output of the amplifier, the rail-to-rail output section having means for limiting the current through the output section.

9. A CMOS amplifier circuit as in claim 8 in which the P-channel input section comprises a three-transistor differential amplifier.

10. A CMOS amplifier circuit as in claim 8 in which the N-channel input section comprises a three-transistor differential amplifier.

11. A CMOS amplifier circuit as in claim 8 in which the folded-cascode gain stage comprises a cascode current mirror having an input coupled to a first cascode current source and an output coupled to a second cascode current source.

12. A CMOS amplifier circuit comprising:
a differential input and a single-ended output;
a P-channel input section having a differential input coupled to the differential input of the amplifier, and differential output;
an N-channel input section having a differential input coupled to the differential input of the amplifier, and a differential output;
a folded-cascode gain stage having first and second summing nodes coupled to the differential output of the P-channel input section, third and fourth summing nodes coupled to the differential output of the N-channel input section, and an output;
a rail-to-rail output section having an input coupled to the output of the folded-cascode gain stage and an output coupled to the single-ended output of the amplifier, the rail-to-rail output section having means for limiting the current through the output section; and
bias voltage generating means for generating multiple bias voltages, the bias voltage generating means being coupled to the P-channel and N-channel input sections, the folded-cascode gain stage, and the rail-to-rail output section.

13. A CMOS amplifier circuit as in claim 12 in which the bias voltage generating means generates first, second, third, and fourth bias voltages.

14. In a CMOS operational amplifier, a fully rail-to-rail amplification method comprising the steps of:
sensing a first portion of a rail-to-rail input voltage;
producing a differential current of a first polarity proportional to the first portion of the input voltage;
sensing a second portion of a rail-to-rail input voltage;
producing a differential current of a second polarity proportional to the second portion of the input voltage;
combining the differential current of the first and second polarities;
producing a single-ended voltage in response to the combined differential current; and
converting the single-ended voltage into a rail-to-rail single-ended output voltage by amplying the single-ended voltage with a current-limited rail-to-rail output section.

15. The method of claim 14 in which the combining step comprises the steps of:
generating first and second bias currents;
augmenting the value of the first and second bias currents with one of the differential currents;
applying the augmented first and second bias currents, respectively, to the input and output of a current mirror; and
augmenting the gain of the current mirror with the other of the differential currents.

16. The method of claim 15 in which the step of producing a single-ended voltage comprises the step of producing the single-ended voltage at the output of the current mirror.

* * * * *